United States Patent
Sung et al.

(10) Patent No.: US 10,297,597 B2
(45) Date of Patent: May 21, 2019

(54) COMPOSITE ISOLATION STRUCTURES FOR A FIN-TYPE FIELD EFFECT TRANSISTOR

(71) Applicant: GLOBALFOUNDRIES Inc., Grand Cayman (KY)

(72) Inventors: Min Gyu Sung, Latham, NY (US); Ruilong Xie, Niskayuna, NY (US); Chanro Park, Clifton Park, NY (US); Murat Kerem Akarvardar, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/689,711

(22) Filed: Aug. 29, 2017

(65) Prior Publication Data

US 2018/0096998 A1 Apr. 5, 2018

Related U.S. Application Data

(63) Continuation-in-part of application No. 15/284,110, filed on Oct. 3, 2016, now Pat. No. 9,953,879.

(51) Int. Cl.
| | |
|---|---|
| *H01L 29/66* | (2006.01) |
| *H01L 27/088* | (2006.01) |
| *H01L 21/8234* | (2006.01) |
| *H01L 21/311* | (2006.01) |
| *H01L 29/06* | (2006.01) |

(Continued)

(52) U.S. Cl.
CPC .... *H01L 27/0886* (2013.01); *H01L 21/31111* (2013.01); *H01L 21/31144* (2013.01); *H01L 21/823431* (2013.01); *H01L 21/823481* (2013.01); *H01L 29/0649* (2013.01); *H01L 29/66795* (2013.01); *H01L 21/0217* (2013.01); *H01L 21/0228* (2013.01); *H01L 21/02164* (2013.01); *H01L 21/31053* (2013.01)

(58) Field of Classification Search
CPC ............ H01L 27/0886; H01L 29/0649; H01L 29/1604; H01L 29/161; H01L 21/823481; H01L 21/76224; H01L 29/66795
See application file for complete search history.

(56) References Cited

U.S. PATENT DOCUMENTS

| | | | |
|---|---|---|---|
| 9,508,604 B1 * | 11/2016 | Sung | ............... H01L 21/823821 |
| 2006/0118876 A1 * | 6/2006 | Lee | ................... H01L 29/66795 |
| | | | 257/365 |
| 2011/0081782 A1 | 4/2011 | Liang et al. | |

(Continued)

*Primary Examiner* — Laura M Menz
*Assistant Examiner* — Candice Chan
(74) *Attorney, Agent, or Firm* — Thompson Hine LLP; Anthony Canale

(57) ABSTRACT

Structures for the isolation of a fin-type field-effect transistor and methods of forming isolation for a fin-type field-effect transistor. A first dielectric layer is formed that encapsulates a plurality of fins. A second dielectric layer is formed that surrounds the first dielectric layer and the plurality of fins. A surface of the second dielectric layer relative to a surface of the first dielectric layer. A liner is conformally deposited on the surface of the first dielectric layer and on the recessed surface of the second dielectric layer. A section of the liner is removed to expose the surface of the first dielectric layer. The exposed surface of the first dielectric layer is recessed to reveal a portion of each of the plurality of fins.

6 Claims, 10 Drawing Sheets

(51) Int. Cl.
*H01L 21/02* (2006.01)
*H01L 21/3105* (2006.01)

(56) References Cited

U.S. PATENT DOCUMENTS

| | | |
|---|---|---|
| 2014/0227858 A1 | 8/2014 | Shen et al. |
| 2015/0228653 A1 | 8/2015 | Cheng et al. |
| 2015/0340500 A1 | 11/2015 | Brunco |
| 2017/0047447 A1* | 2/2017 | Chiu ................... H01L 29/7848 |

* cited by examiner

COMPOSITE ISOLATION STRUCTURES FOR A FIN-TYPE FIELD EFFECT TRANSISTOR

CROSS-REFERENCE TO RELATED APPLICATIONS

This application is a continuation-in-part of U.S. application Ser. No. 15/284,110, filed Oct. 3, 2016, which is hereby incorporated by reference herein in its entirety.

BACKGROUND

The present invention generally relates semiconductor devices and integrated circuit fabrication and, in particular, to structures for the isolation of a fin-type field-effect transistor (FinFET) and methods of forming isolation for a fin-type field-effect transistor.

As the fin pitch of FinFETs continues to shrink, deposition of gap fill using HARP $SiO_2$ becomes problematic, because voids begin to form. To combat the void issue, flowable oxide has been used. However, this requires a high temperature seam anneal in order to achieve densification, which may also cause fin oxidation after removal of unwanted fins.

SUMMARY

Thus, a need continues to exist for a way to prevent oxidation defects in strain-relaxed fins exposed to a high temperature seam anneal by reducing local gap fill voids. This need and other needs are fulfilled by the embodiments of the structures for FinFET isolation and the methods of forming FinFET isolation that are described herein.

In embodiments, a method includes forming a first dielectric layer encapsulating a plurality of fins, forming a second dielectric layer surrounding the first dielectric layer and the plurality of fins, and recessing a surface of the second dielectric layer relative to a surface of the first dielectric layer. The method further includes conformally depositing a liner on the surface of the first dielectric layer and on the recessed surface of the second dielectric layer, removing a section of the liner to expose the surface of the first dielectric layer, and recessing the exposed surface of the first dielectric layer to reveal a portion of each of the plurality of fins.

In embodiments, a structure includes a plurality of fins, a first dielectric layer having a surface arranged to reveal a first portion of each of the plurality of fins and to encapsulate a second portion of each of the plurality of fins beneath the surface, and a second dielectric layer surrounding the first dielectric layer and the plurality of fins. A liner has a section arranged horizontally on a surface of the second dielectric layer.

The shortcomings of the prior art are overcome and additional advantages are provided through the provision, in one aspect, of a method of reducing or eliminating voids in gap fill material of semiconductor structures. The method includes providing a starting semiconductor structure, the starting semiconductor structure including a stress-relaxed buffer (SRB) semiconductor substrate with a relatively low concentration of germanium in silicon germanium, a plurality fins coupled to the SRB semiconductor substrate, each fin including a top active region with a relatively higher percentage of germanium in silicon germanium as compared to the SRB semiconductor substrate, and a bottom fin body, a hard mask cap over each fin, the starting semiconductor structure also having a conformal blanket hard mask layer thereover. The method further includes forming a densified local isolation layer around the fins, resulting in a local fin structure, forming a protective layer around the local fin structure, resulting in a protected local fin structure, forming a densified global isolation layer on either side of the protected local fin structure up to a bottom surface of active areas of the plurality of fins, and exposing the active regions of the plurality of fins.

In accordance with another aspect, a semiconductor structure is provided. The semiconductor structure includes a strain-relaxed semiconductor substrate, a plurality of fins on the strain-relaxed semiconductor substrate, the plurality of fins each having a bottom inactive region and an exposed top active region, a liner layer along sidewalls of the bottom inactive region and adjacent surface areas of the strain-relaxed semiconductor substrate, a densified local fill layer surrounding the bottom inactive regions of the plurality of fins, a densified global fill layer adjacent outer sidewalls of the densified local fill layer, and a hard mask layer separating the densified global fill layer from the substrate and the densified local fill layer, a lack of voids in the densified local fill layer resulting in the bottom inactive regions of the plurality of fins being substantially free of oxidation defects.

These, and other objects, features and advantages of this invention will become apparent from the following detailed description of the various aspects of the invention taken in conjunction with the accompanying drawings.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, the same reference numbers are used throughout different figures to designate the same or similar components.

DETAILED DESCRIPTION

Figure 1:
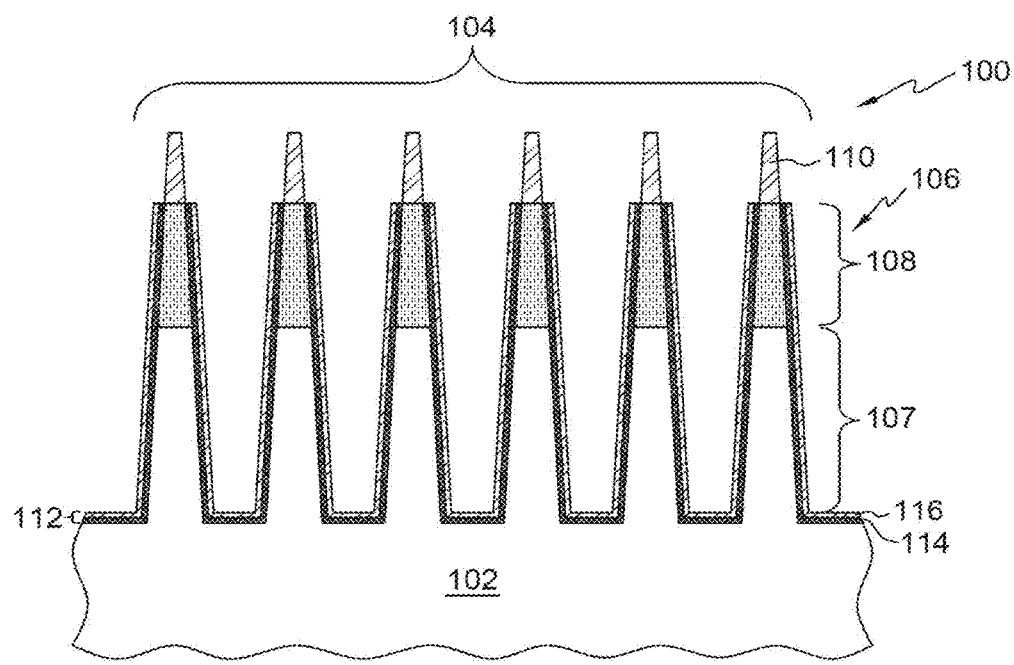
FIG. 1 is a cross-sectional view of one example of a starting semiconductor structure, the starting semiconductor substrate including a strain-relaxed semiconductor substrate, fins on the substrate, each fin including a bottom inactive region and a top active region, a fin hard mask layer over the fin, and a liner layer conformally covering the fins and substrate, the liner layer including, for example, an inner dielectric layer and an outer dielectric layer, in accordance with one or more aspects of the present invention.

With reference to FIG. 1 and in accordance with embodiments of the invention, a starting semiconductor structure 100 may include a strain-relaxed semiconductor substrate 102 and fins 104 in a fin array 106 on the substrate 102. Each of the fins 104 includes a bottom inactive region 107 and a top active region 108. A fin hard mask layer 110 (e.g., silicon nitride) is arranged over each of the fins 104. A liner layer 112 is deposited that conformally covers the fins 104 and substrate 102. The liner layer 112 may include, for example, an inner dielectric layer 114 (e.g., silicon dioxide) and an outer dielectric layer 116 (e.g., silicon nitride).

In an embodiment, the substrate may be composed of silicon-germanium with a germanium content of, for example, 20%. In embodiments, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition, or instead, include various isolations, dopings, and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The fins 104 may be, for example, etched from a bulk substrate, and may include, for example, any of the materials listed above with respect to the substrate. In an embodiment, the active regions 108 of the fins 104 may be composed of silicon-germanium (SiGe) for use in forming a p-type field-effect transistor, such as SiGe with a germanium content of, for example, 40%. In an embodiment, the active regions 108 of the fins 104 may be composed of silicon (Si) for use in forming an n-type field-effect transistor. Further, some or all of the fins 104 may include added impurities (e.g., by doping), making them either n-type or p-type.

Figure 2:
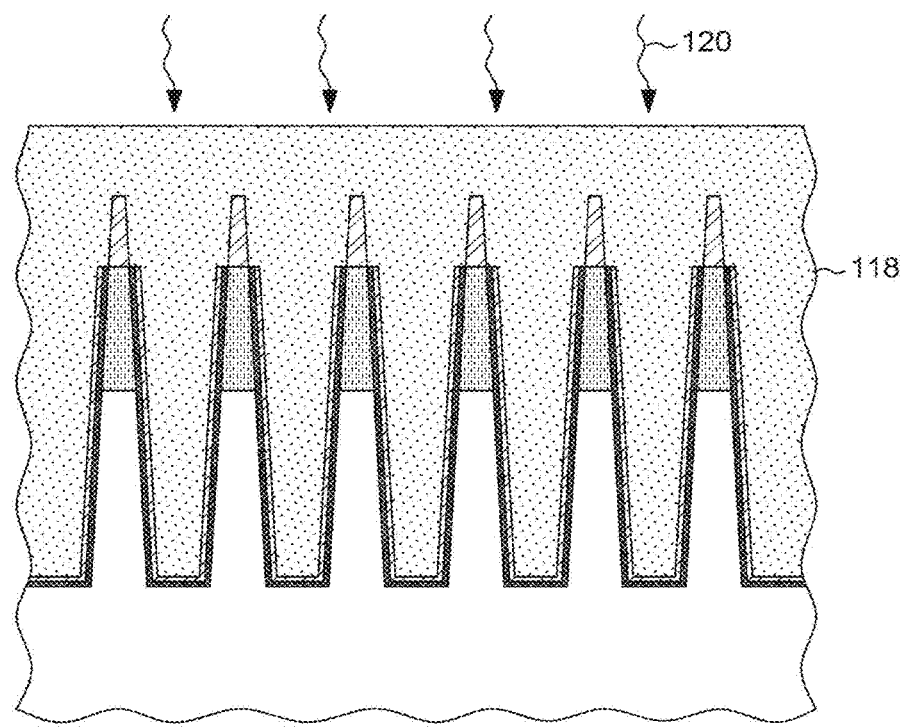
FIG. 2 depicts one example of the starting semiconductor structure of FIG. 1 after forming a blanket conformal dielectric gap fill layer (e.g., a flowable oxide) and performing a densification anneal, in accordance with one or more aspects of the prevent invention.

With reference to FIG. 2 in which like reference numerals refer to like features in FIG. 1 and at a subsequent fabrication stage of the processing method, a blanket conformal dielectric gap fill layer 118 (e.g., a flowable oxide) is formed by, for example, flowable chemical vapor deposition (FCVD) on the starting semiconductor structure 100. A densification anneal 120 is performed, after the gap fill layer 118 is formed, to provide a densified local fill. The outer dielectric layer 116, which surrounds the gap fill layer 118, encapsulates and protects the fins 104 against oxidation during the densification anneal 120. The densification anneal 120 may entail a timed oxidation process performed using steam as an oxidant.

Figure 3:
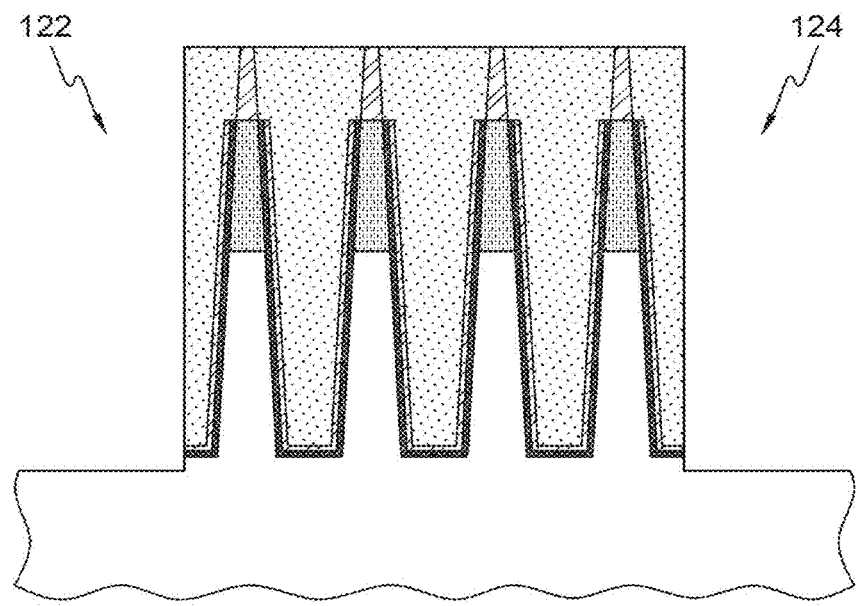
FIG. 3 depicts one example of the structure of FIG. 2 after performing a fin cut; in this example, opening areas, in accordance with one or more aspects of the present invention.

With reference to FIG. 3 in which like reference numerals refer to like features in FIG. 2 and at a subsequent fabrication stage of the processing method, the gap fill layer 118 is planarized using a chemical-mechanical polishing (CMP) process to provide a top surface that is coplanar relative to the fin hard mask layer 110 serving as a polish stop. A fin cut is performed that removes some of the fins 104 in the fin array 106, and that thereby opens areas 122 and 124 on a top surface of the substrate 102 adjacent to the remaining fins 104 at the side edges of the fin array 106.

Figure 4:
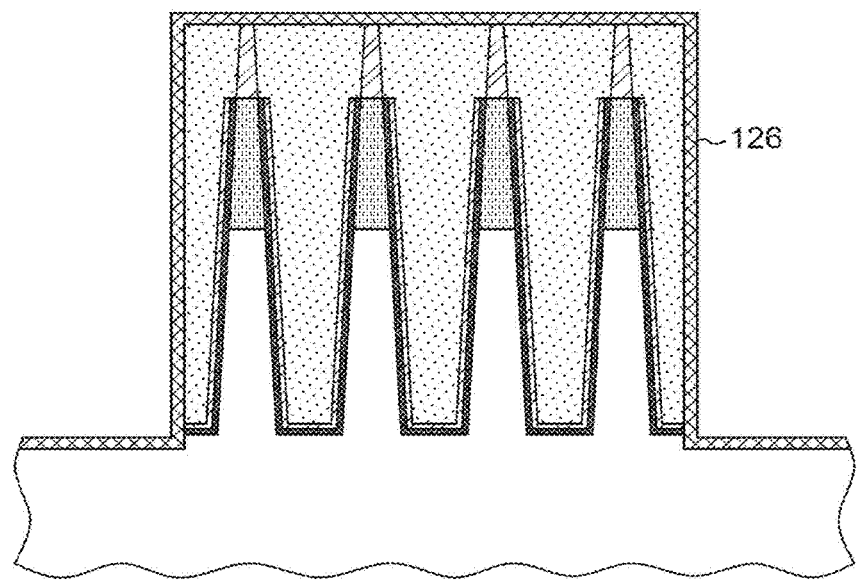
FIG. 4 depicts one example of the structure of FIG. 3 after forming a hard mask layer over the structure and substrate, in accordance with one or more aspects of the present invention.

With reference to FIG. 4 in which like reference numerals refer to like features in FIG. 3 and at a subsequent fabrication stage of the processing method, a dielectric layer 126 (e.g., silicon nitride) is formed as a hard mask over the semiconductor structure 100 and substrate 102. The dielectric layer 126 serves as a liner that covers the gap fill layer 118 and the fins 104 that are embedded in the gap fill layer 118.

Figure 5:
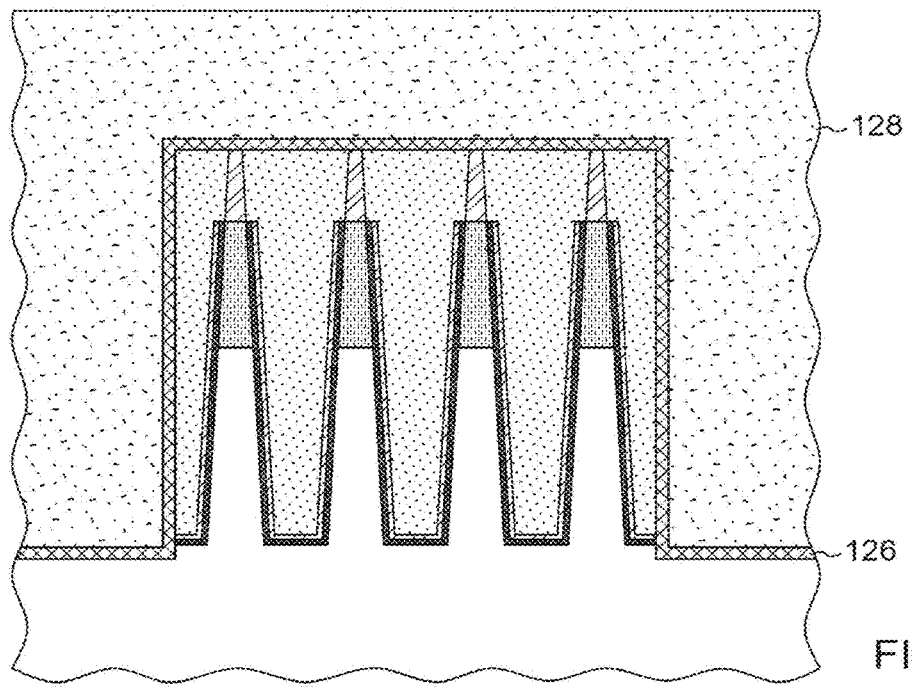
FIG. 5 depicts one example of the structure of FIG. 4 after forming a blanket dielectric layer (e.g., using a flowable oxide), in accordance with one or more aspects of the present invention.

With reference to FIG. 5 in which like reference numerals refer to like features in FIG. 4 and at a subsequent fabrication stage of the processing method, a blanket dielectric gap fill layer 128 (e.g., a flowable oxide) is formed by, for example, flowable chemical vapor deposition (FCVD). The gap fill layer 128 provides a global fill and, in particular, fills the opens areas 122 and 124 on a top surface of the substrate 102 adjacent to the fin array 106. The gap fill layer 128 and the gap fill layer 118, which are formed at different times in the processing method, are separated from each other by a vertical section of the dielectric layer 126.

Figure 6:
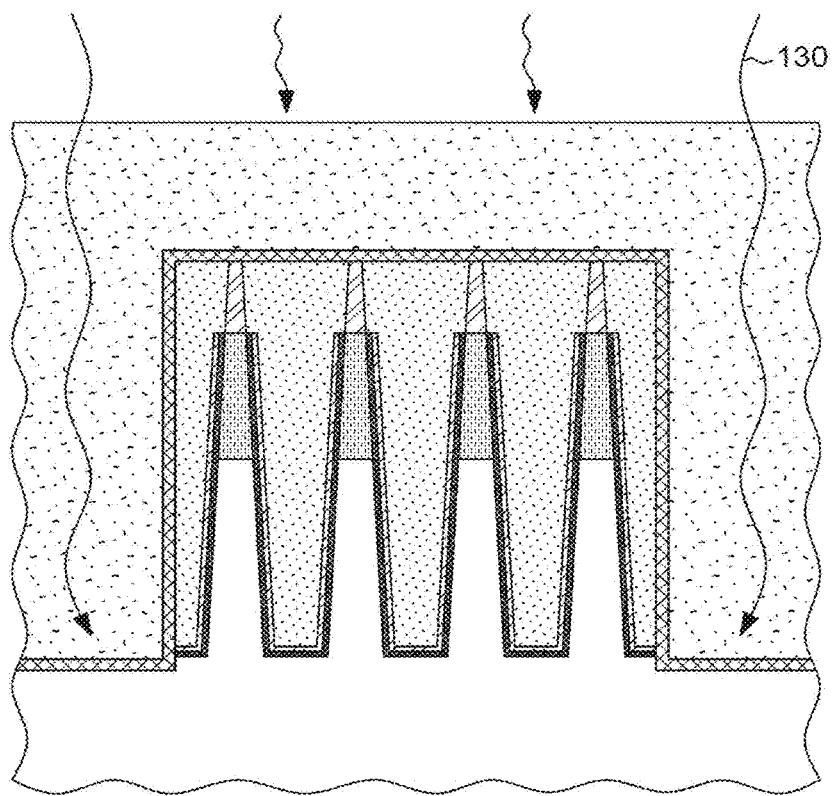
FIG. 6 depicts one example of the structure after performing a second densification anneal of the blanket dielectric layer, in accordance with one or more aspects of the present invention.

With reference to FIG. 6 in which like reference numerals refer to like features in FIG. 5 and at a subsequent fabrication stage of the processing method, a densification anneal 130 of the blanket dielectric gap fill layer 128 is performed. During the densification anneal 130, the dielectric layer 126 protects the substrate 102 against oxidation in areas 122 and 124.

Figure 7:
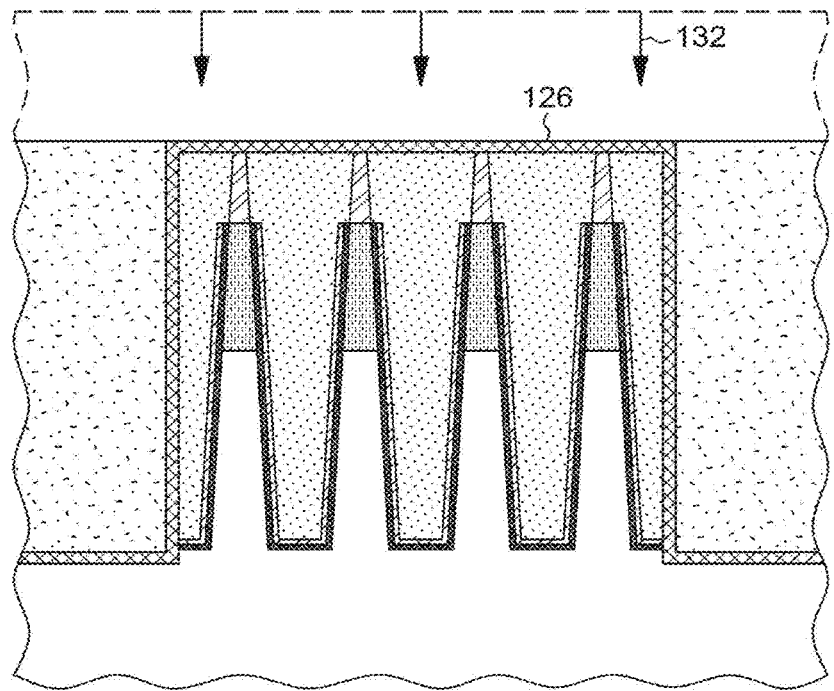
FIG. 7 depicts one example of the structure of FIG. 6 after planarizing down to the hard mask layer, in accordance with one or more aspects of the present invention.

With reference to FIG. 7 in which like reference numerals refer to like features in FIG. 6 and at a subsequent fabrication stage of the processing method, the gap fill layer 128 is planarized, as diagrammatically indicated by reference numeral 132, using a chemical-mechanical polishing (CMP) process to provide a top surface that is coplanar relative to the dielectric layer 126, which serves as a polish stop.

Figure 8:
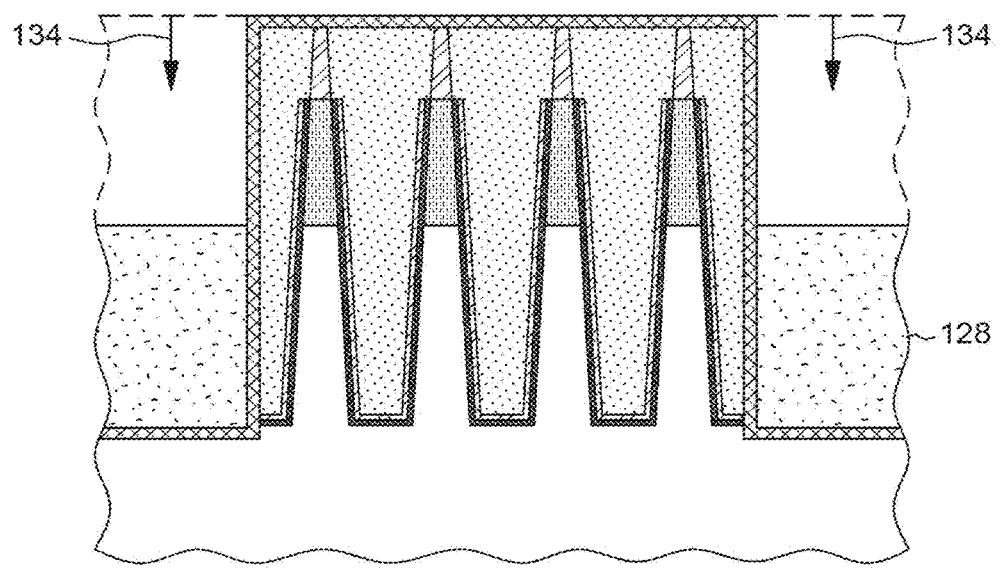
FIG. 8 depicts one example of the structure of FIG. 7 after recessing the blanket dielectric layer, in accordance with one or more aspects of the present invention.

With reference to FIG. 8 in which like reference numerals refer to like features in FIG. 7 and at a subsequent fabrication stage of the processing method, the gap fill layer 128 is recessed, as indicated diagrammatically by reference numeral 134. The global fill represented by the gap fill layer 128 may be recessed to have a thickness equal to the height of the bottom inactive region 107 of the fins 104, which reveals the top active region 108 of the fins 104. The local fill represented by the gap fill layer 118 is not recessed due to coverage by the dielectric layer 126. The etching process recessing the gap fill layer 128 uses an etchant that removes the material of the gap fill layer 128 selective to the material of the dielectric layer 126. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. For example, buffered hydrofluoric acid may be used to remove silicon dioxide constituting the gap fill layer 128 selective to silicon nitride constituting the dielectric layer 126.

Figure 9:
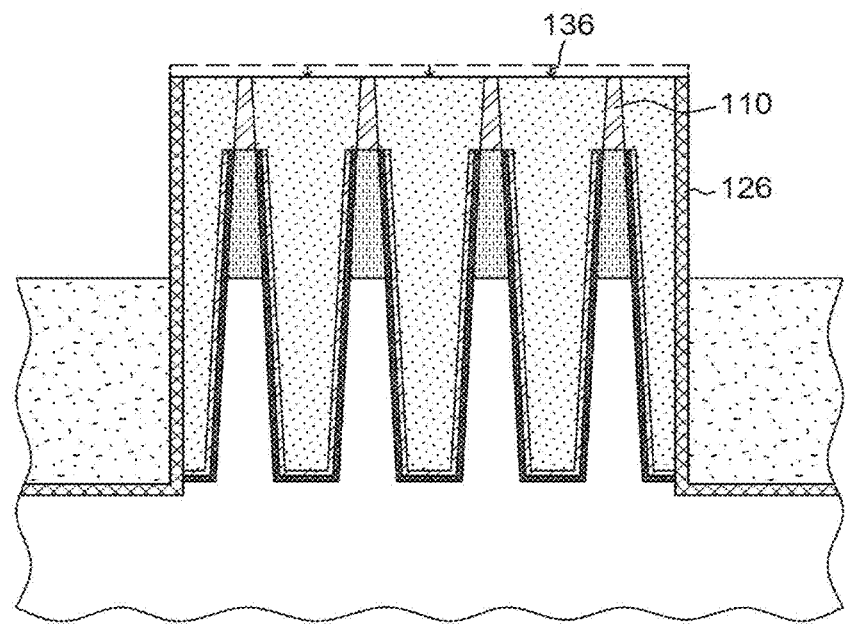
FIG. 9 depicts one example of the structure of FIG. 8 after etching back the hard mask layer down to the fin hard mask layer, in accordance with one or more aspects of the present invention.

With reference to FIG. 9 in which like reference numerals refer to like features in FIG. 8 and at a subsequent fabrication stage of the processing method, the dielectric layer 126 may be etched back and removed, as diagrammatically indicated by reference numeral 136, using a reactive ion etching process to reveal the top surfaces of the gap fill layer 118 and the fin hard mask layer 110 on each of the fins 104.

Figure 10:
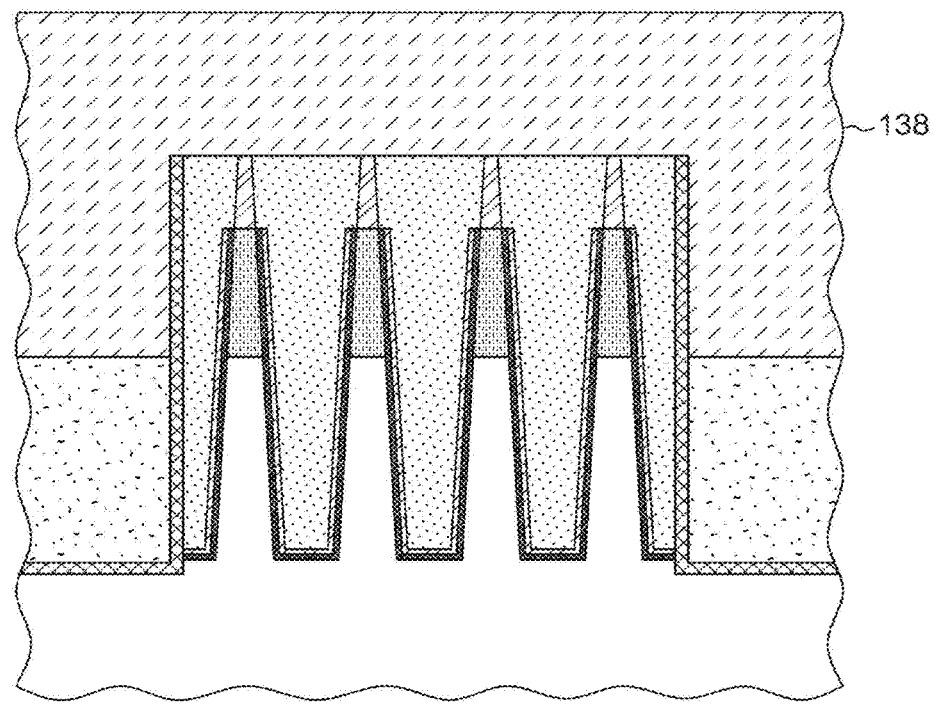
FIG. 10 depicts one example of the structure of FIG. 9 after forming an optical planarization layer (OPL) over the structure, in accordance with one or more aspects of the present invention.

With reference to FIG. 10 in which like reference numerals refer to like features in FIG. 9 and at a subsequent fabrication stage of the processing method, an organic planarization layer (OPL) 138 is formed over the structure.

Figure 11:
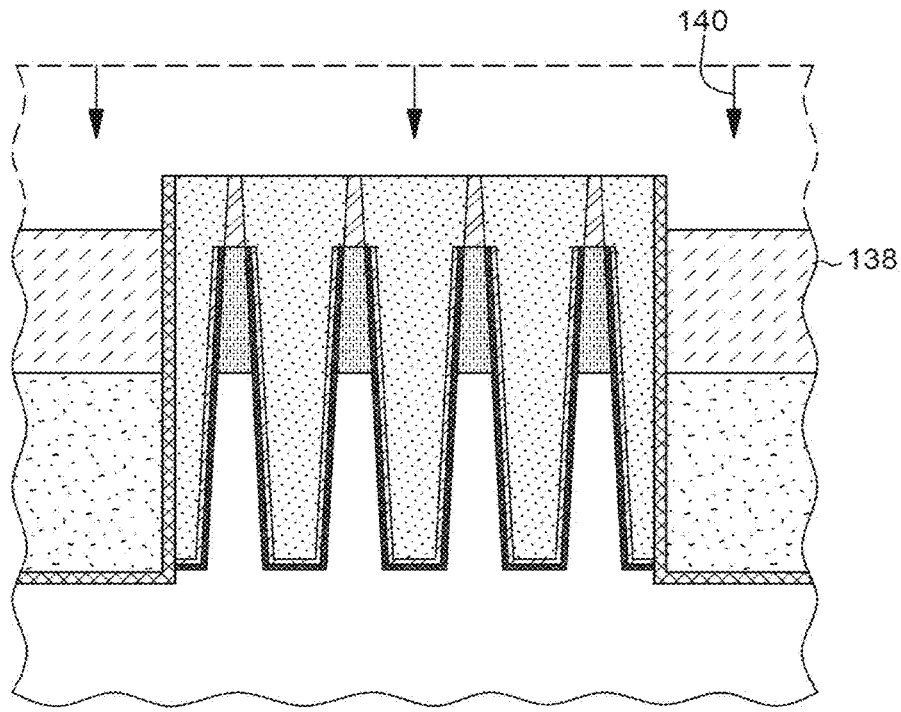
FIG. 11 depicts one example of the structure of FIG. 10 after recessing the OPL, in accordance with one or more aspects of the present invention.

With reference to FIG. 11 in which like reference numerals refer to like features in FIG. 10 and at a subsequent fabrication stage of the processing method, the OPL 138 is recessed, as diagrammatically indicated by reference numeral 140, and partially removed. The local fill represented by gap fill layer 118 is exposed, and the global fill represented by gap fill layer 128 is covered by the OPL 138.

Figure 12:
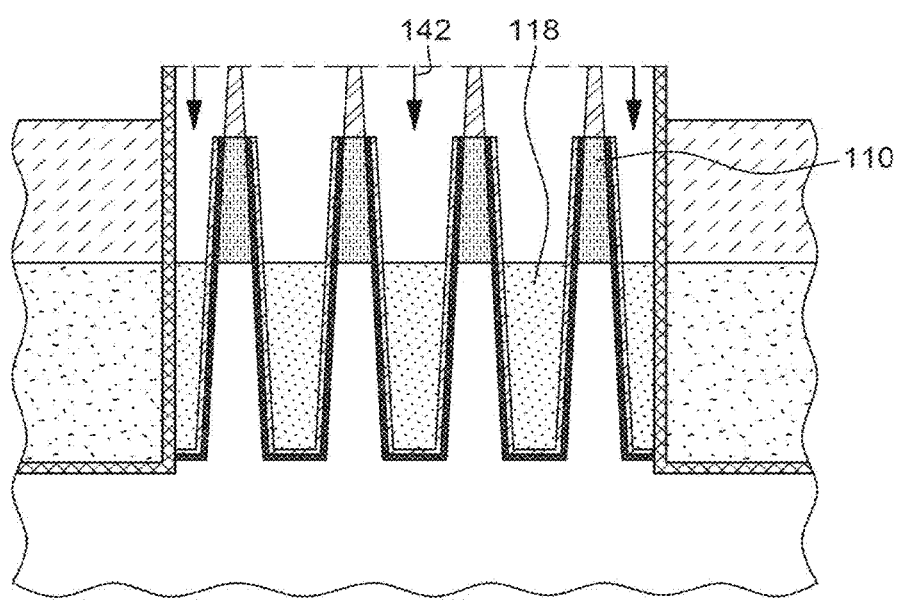
FIG. 12 depicts one example of the structure of FIG. 11 after recessing the blanket conformal dielectric gap fill layer down to a bottom of fin active region, in accordance with one or more aspects of the present invention.

With reference to FIG. 12 in which like reference numerals refer to like features in FIG. 11 and at a subsequent fabrication stage of the processing method, the gap fill layer 118 is recessed, as diagrammatically indicated by reference numeral 142, using an etch-back process down to a bottom of active region 108 in order to reveal the active regions 108 of the fins 104. The global fill represented by gap fill layer 128 is covered by the OPL 138 and not recessed.

Figure 13:
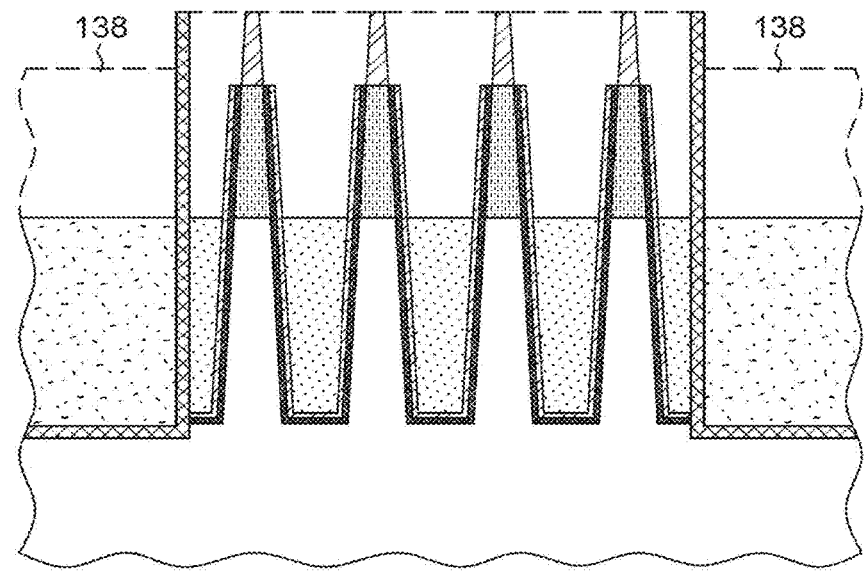
FIG. 13 depicts one example of the structure of FIG. 12 after removing the remaining OPL, in accordance with one or more aspects of the present invention.

With reference to FIG. 13 in which like reference numerals refer to like features in FIG. 12 and at a subsequent fabrication stage of the processing method, the remaining OPL 138 is removed to expose the global fill represented by gap fill layer 128.

Figure 14:
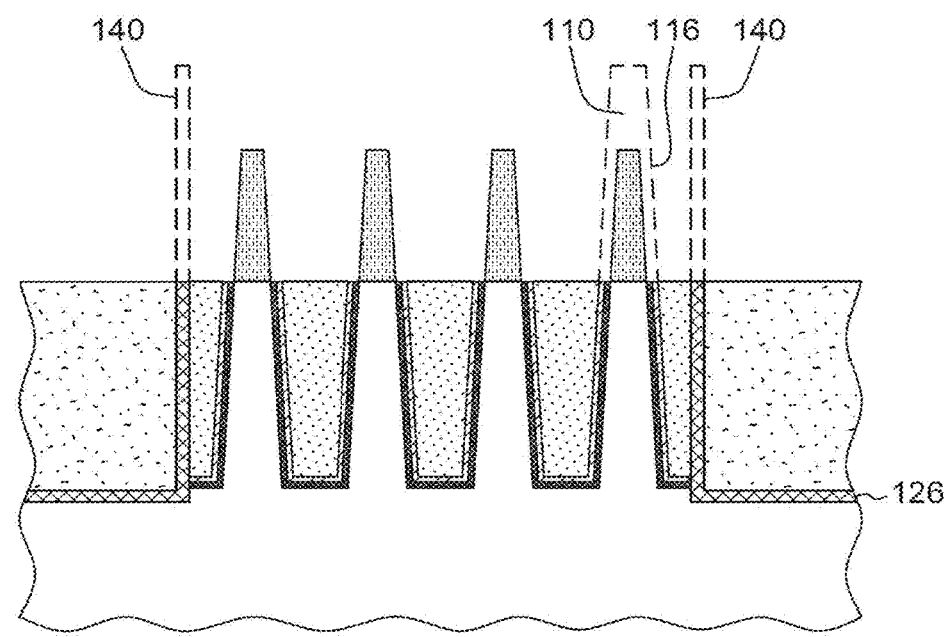
FIG. 14 depicts one example of the structure of FIG. 13 after removing exposed portions of the hard mask layer, the fin hard mask layer and the exposed liner layer, in accordance with one or more aspects of the present invention.

With reference to FIG. 14 in which like reference numerals refer to like features in FIG. 13 and at a subsequent fabrication stage of the processing method, exposed portions 140 of the dielectric layer 126, fin hard mask layer 110, and liner layer 112 are removed.

In a first aspect, disclosed above is a method. The method includes providing a starting semiconductor structure, the starting semiconductor structure including a stress-relaxed buffer (SRB) semiconductor substrate with a relatively low concentration of germanium in silicon germanium, fins coupled to the SRB semiconductor substrate, each fin including a top active region with a relatively higher percentage of germanium in silicon germanium as compared to the SRB semiconductor substrate, and a bottom fin body, a hard mask cap over each fin, the starting semiconductor structure also having a conformal blanket hard mask layer thereover. The method further includes forming a densified local isolation layer around the fins, resulting in a local fin structure, forming a protective layer around the local fin structure, resulting in a protected local fin structure, forming a densified global isolation layer on either side of the protected local fin structure up to a bottom surface of active areas of the plurality of fins, and exposing the active regions of the plurality of fins.

In one example, forming the densified local isolation layer may include, for example, forming a local isolation layer around the fins, and annealing the local isolation layer, resulting in the densified local isolation layer. In one example, forming the local isolation layer around the fins may include, for example, forming a layer of silicon dioxide using a chemical-vapor deposition process.

In one example, forming the protective layer in the method of the first aspect may include, for example, forming a hard mask layer.

In one example, forming the densified global isolation layer in the method of the first aspect may include, for example, forming a global isolation layer over the structure, and annealing the global isolation layer, resulting in the densified global isolation layer. In one example, forming the global isolation layer may include, for example, forming a global silicon dioxide layer using a chemical-vapor deposition process.

In one example, exposing the active regions of the fins in the method of the first aspect may include, for example, removing a top horizontal portion of the protective layer, recessing the densified local isolation layer down to the bottom surfaces of the active areas of the fins, the recessing resulting in exposed hard mask material, and removing the exposed hard mask material, leaving the active areas exposed. In one example, removing the exposed hard mask layer may include, for example, selective removal of the exposed hard mask layer.

In one example, the method may further include, for example, after removing the top horizontal portion and before recessing the densified local isolation layer, forming a protective layer around the structure, and recessing the protective layer to expose the densified local isolation layer, hard mask caps and side portions of the conformal blanket hard mask layer.

In one example, the method of the first aspect may further include, for example, after forming the densified local isolation layer and before forming the protective layer around the local fin structure, removing unwanted fins and associated portions of the densified local isolation layer, and forming the protective layer around the remaining fins and associated densified local isolation layer.

In a second aspect, disclosed above is a semiconductor structure. The semiconductor structure includes a strain-relaxed semiconductor substrate, fins on the strain-relaxed semiconductor substrate, the fins each having a bottom inactive region and an exposed top active region. The semiconductor structure further includes a liner layer along sidewalls of the bottom inactive region and adjacent surface areas of the strain-relaxed semiconductor substrate, a densified local fill layer surrounding the bottom inactive regions of the fins, a densified global fill layer adjacent outer sidewalls of the densified local fill layer, and a hard mask layer separating the densified global fill layer from the substrate and the densified local fill layer, a lack of voids in the densified local fill layer resulting in the bottom inactive regions of the fins being substantially free (e.g., at least about 90%) of oxidation defects.

In one example, the fins may include, for example, n-type fin(s) and p-type fin(s). In one example, the strain-relaxed semiconductor substrate may include, for example, silicon germanium, the n-type fin(s) includes silicon, and the p-type fin(s) includes silicon germanium of a higher germanium concentration than the strain-relaxed semiconductor substrate.

In one example, the densified local gap fill layer of the semiconductor structure of the second aspect may include, for example, a flowable oxide.

In one example, the densified global gap fill layer of the semiconductor structure of the second aspect may include for example, a flowable oxide.

In one example, the liner layer of the semiconductor structure of the second aspect may include, for example, an inner dielectric layer, and an outer hard mask layer.

Figure 15:
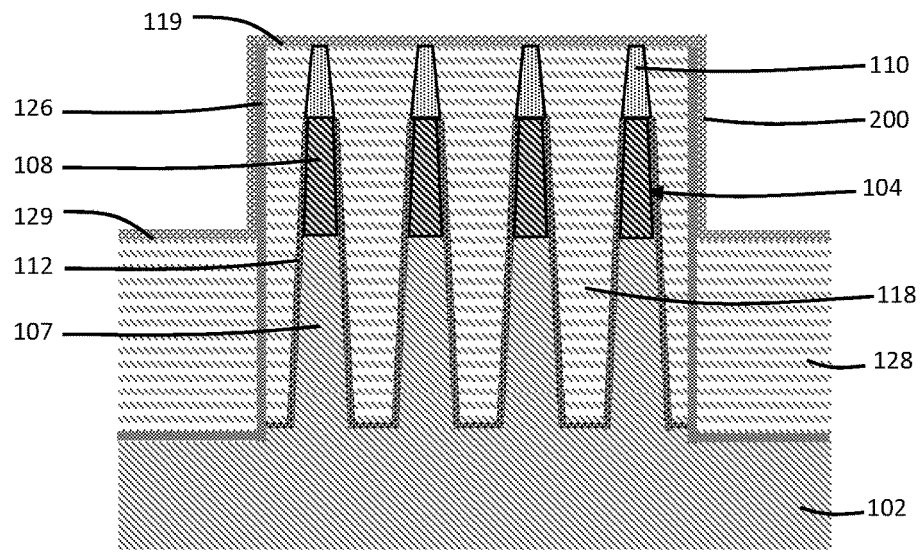
FIGS. 15-19 are cross-sectional views of a device structure at successive stages of a processing method in accordance with embodiments of the invention.

With reference to FIG. 15 in which like reference numerals refer to like features in FIG. 9 and at a subsequent fabrication stage of the processing method in accordance with alternative embodiments of the invention, a conformal dielectric layer 200 is formed that covers the top surface 119 of the gap fill layer 118 and also covers the recessed top surface 129 of the gap fill layer 128 in areas 122 and 124, and also forms as vertical sections on the vertical sections of the dielectric layer 126 at the side edges of the gap fill layer 118. The conformal dielectric layer 200 may be composed of a dielectric material, such as silicon nitride ($Si_3N_4$), deposited by atomic layer deposition (ALD). In conjunction with the formation of the conformal dielectric layer 200, the removal of the dielectric layer 126 described in the context of FIG. 9 may be omitted. The conformal dielectric layer 200 is significantly thinner than the active regions 108 of the fins 104 and either of the gap fill dielectric layers 128, 138.

Figure 16:
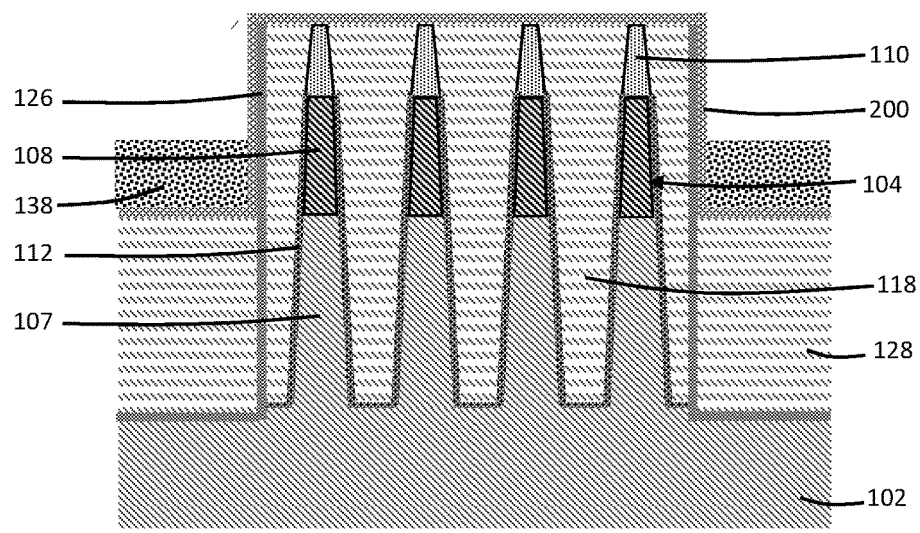

With reference to FIG. 16 in which like reference numerals refer to like features in FIG. 15 and at a subsequent fabrication stage of the processing method, the OPL 138 is formed on the top surface 129 of the gap fill layer 128 and partially recessed as described in the context of FIGS. 10 and 11. After being recessed, the OPL 138 covers the global fill represented by the gap fill layer 128.

Figure 17:
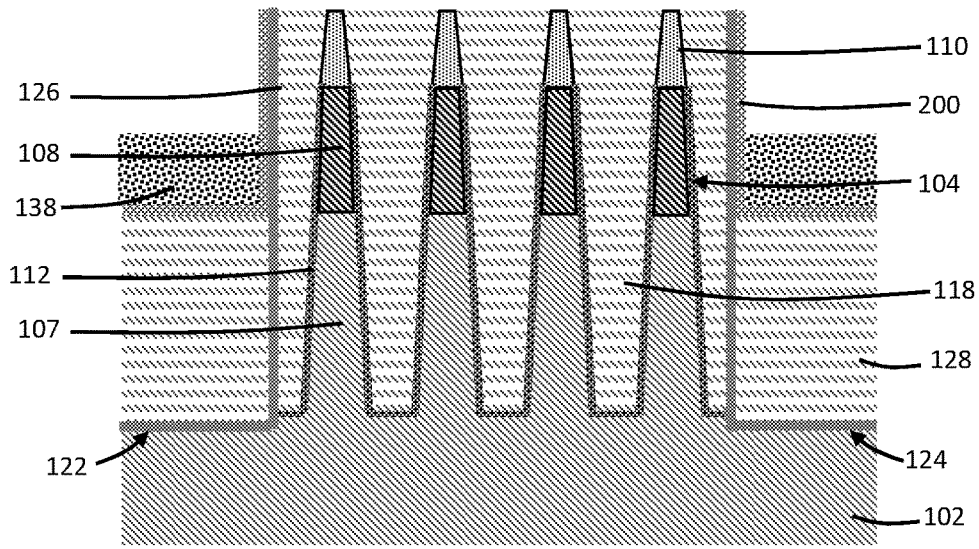

With reference to FIG. 17 in which like reference numerals refer to like features in FIG. 16 and at a subsequent fabrication stage of the processing method, the conformal dielectric layer 200 and, if present, the dielectric layer 126 are removed above the level of the recessed OPL 138 using an etching process. The removal of the layers 126, 200 exposes the top surface of the gap fill layer 118 representing the local fill and fin hard mask layer 110 at the top surface of the gap fill layer 118. In an embodiment, the etching process may be an isotropic etching process that removes the material of the conformal dielectric layer 200 selective to the material of the gap fill layer 118. During the etching process, the OPL 138 covers and protects sections of the conformal dielectric layer 200 in areas 122 and 124 on the top surface 129 of the gap fill layer 128.

Figure 18:
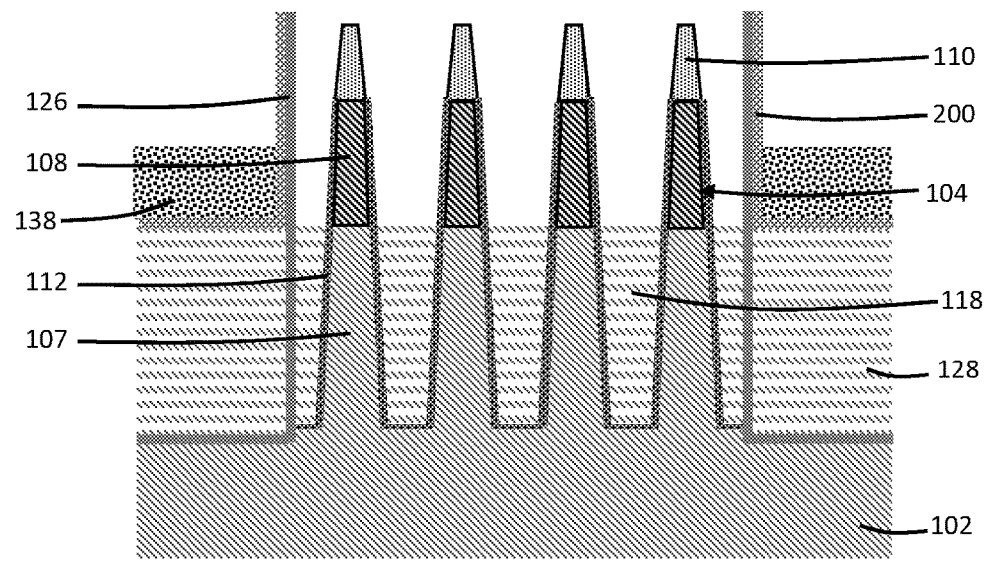

With reference to FIG. 18 in which like reference numerals refer to like features in FIG. 17 and at a subsequent fabrication stage of the processing method, the top surface 119 of the gap fill layer 118 is recessed, as diagrammatically indicated by reference numeral 142, using an etch-back process in order to reveal the active regions 108 of the fins 104. During the etching process, sections of the OPL 138 act as an etch mask that covers and protects the gap fill layer 128 representing the global fill. In an embodiment, after being recessed, the recessed top surface 119 of the gap fill layer 118 may be coplanar with the recessed top surface of the gap fill layer 128. The recessed top surface 119 of the gap fill layer 118 may be planar such that the exposed height of the active regions 108 of the fins 104 is uniform among the different fins 104.

Figure 19:
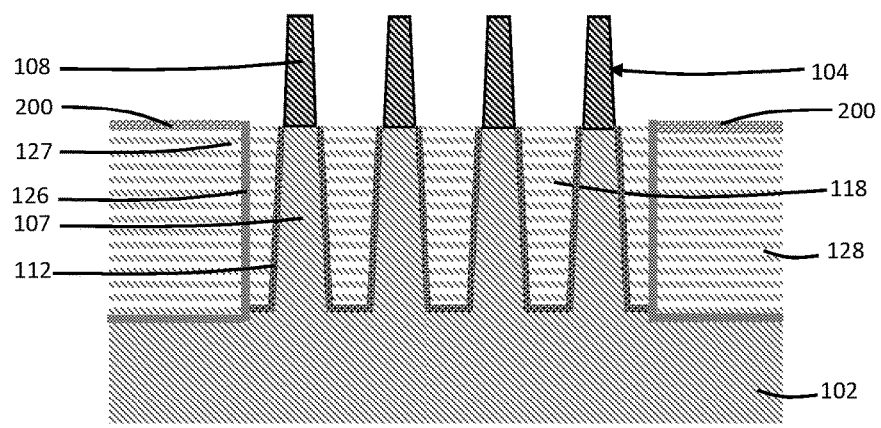

With reference to FIG. 19 in which like reference numerals refer to like features in FIG. 18 and at a subsequent fabrication stage of the processing method, sections of the conformal dielectric layer 200 exposed by the recessing of the gap fill layer 118, the liner layer 112, and the fin hard mask layer 110 are removed, followed by the removal of the OPL 138. Sections of the conformal layer 200 remain on the top surface 129 of the gap fill layer 128 representing the global fill in areas 122, 124 on the top surface of the substrate 102. A vertical section of the dielectric layer 126 is arranged between the gap fill layer 118 and the gap fill layer 128. The vertical section of the dielectric layer 126 intersects the sections of the conformal layer 200 on the top surface 129 of the gap fill layer 128 in areas 122 and 124. The vertical section of the dielectric layer 126 and the sections of the conformal layer 200 cover a corner 127 of the gap fill layer 128 that is located adjacent to the gap fill layer 118 and the fins 104.

These remaining sections of the conformal dielectric layer 200, in conjunction with the vertical section of the dielectric layer 126, block the diffusion of oxygen from the gap fill layer 128 into the fins 104, particularly oxygen diffusion into the fins 104 located at the ends of the fin array 106, during subsequent processing steps, such as during the formation of an oxide of a dummy gate structure on the exterior surfaces of the active regions 108 of the fins 104. For example, oxygen in the gap fill layer 128 cannot permeate silicon nitride constituting the conformal dielectric layer 200. The blocking of oxygen diffusion may prevent the formation of oxidation defects in the active regions 108 of the fins 104, particularly the fins 104 located at the ends of the fin array 106.

The fins 104 may be used to fabricate a FinFET that further includes a gate stack overlapping with one or more of the fins 104, and source/drain regions. The gate stack may be formed as part of a replacement metal gate process.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a plurality of fins;
a first dielectric layer having a surface arranged to reveal a first portion of each of the plurality of fins and to encapsulate a second portion of each of the plurality of fins beneath the surface;
a second dielectric layer surrounding the first dielectric layer and the plurality of fins, the second dielectric layer having a surface that is coplanar with a portion of the surface of the first dielectric layer;
a first liner including a section arranged horizontally on the surface of the second dielectric layer, the first liner composed of a dielectric material; and
a second liner including a vertical section that is arranged between the first dielectric layer and the second dielectric layer,
wherein the section of the first liner intersects the vertical section of the second liner, and the first liner is absent from the portion of the surface of the first dielectric layer.

2. The structure of claim 1 wherein the surface of the first dielectric layer is planar.

3. The structure of claim 2 wherein each of the plurality of fins includes an active region that is revealed above the surface of the first dielectric layer and an inactive region beneath the surface of the first dielectric layer.

4. The structure of claim 1 wherein the first portion of each of the plurality of fins is an active region, and the second portion of each of the plurality of fins is an inactive region.

5. The structure of claim 1 wherein the section of the first liner and the vertical section of the second liner cover a corner of the second dielectric layer located adjacent to the first dielectric layer.

6. The structure of claim 1 wherein a portion of the first dielectric layer is arranged between the plurality of fins and the vertical section of the second liner.

* * * * *